United States Patent [19]

Kimura

[11] Patent Number: 5,306,969
[45] Date of Patent: Apr. 26, 1994

[54] FREQUENCY MIXER CIRCUIT USING FETS

[75] Inventor: Katsuji Kimura, Tokyo, Japan

[73] Assignee: NEC Corporation, Minato, Japan

[21] Appl. No.: 3,567

[22] Filed: Jan. 13, 1993

[30] Foreign Application Priority Data

| Jan. 14, 1992 | [JP] | Japan | 4-24559 |
| Jan. 22, 1992 | [JP] | Japan | 4-31524 |
| Jan. 24, 1992 | [JP] | Japan | 4-34439 |

[51] Int. Cl.$^5$ ............................................. G06G 7/12
[52] U.S. Cl. ........................................ 307/529; 307/271;
  328/15; 328/16; 328/156
[58] Field of Search ............... 307/529, 271; 328/15,
  328/16, 156

[56] References Cited

U.S. PATENT DOCUMENTS

| 4,546,275 | 10/1985 | Pena-Finol et al. | 307/529 |
| 5,151,625 | 9/1992 | Zarabadi et al. | 328/156 |

OTHER PUBLICATIONS

"Microwave Field–Effect Transistors–Theory, Design and Applications", by Raymond S. Pengelly; Electronic & Electrical Engineering Research Studies, Electronic Devices and Systems Research Studies Series, Research Studies Press; pp. 226–243 (and 4 additional cover/introductory pages).
"Nonlinear Microwave Circuits", FET Mixers, pp. 438–447.

*Primary Examiner*—Margaret R. Wambach
*Attorney, Agent, or Firm*—Burns, Doane, Swecker & Mathis

[57] ABSTRACT

A frequency mixer circuit having a differential pair composed of first and second field effect transistors (FET) whose performance characteristics, or transconductance parameters, are different from each other and whose sources are connected in common. The both FETs are driven with a constant current. An RF signal is applied to the gate of the first FET and a local oscillator signal is applied to the gate of the second FET. An output signal is taken out by converting the drain current of the first or second FET into a voltage. Such a drain current that has a square characteristic can be obtained in each of the first and second FETs, so that even if the local oscillator signal level is lower than that of several volts, the circuit can be operated without raising any problem.

15 Claims, 4 Drawing Sheets

FREQUENCY MIXER CIRCUIT USING FETS

BACKGROUND OF THE INVENTION

1. Field of the Invention

This invention relates to a frequency mixer circuit using field effect transistors (FETs).

2. Description of Related Art

Figure 1:
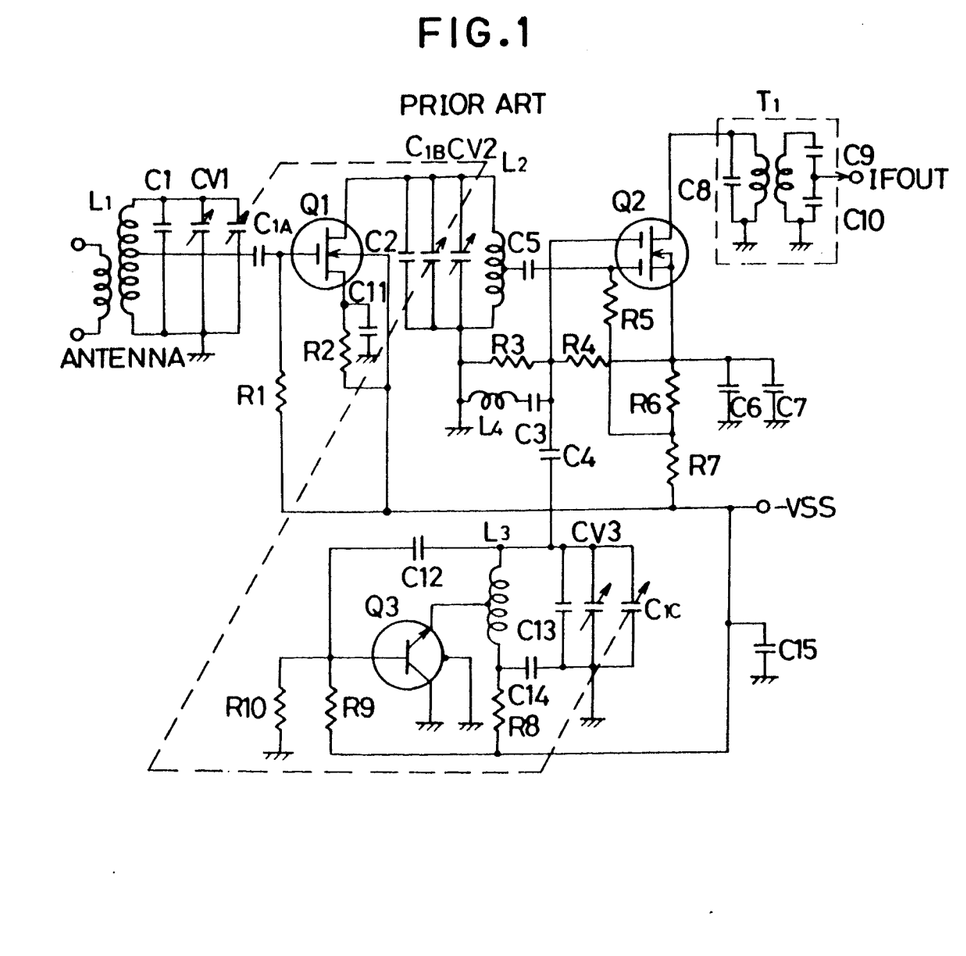
FIG. 1 is a circuit diagram in which a conventional frequency mixer circuit is used.

FIG. 1 shows a circuit provided with a conventional frequency mixer circuit using FETs. The circuit shown in FIG. 1 comprises a frequency mixer circuit using a dual gate metal oxide semiconductor (MOS) FET Q2, a radio frequency (RF) amplifier using a MOS FET Q1 and a local oscillator using a bipolar transistor Q3 which are disposed at the prior stage to the frequency mixer circuit. An RF signal VRF inputted from an antenna is amplified through the RF amplifier and sent to the frequency mixer circuit to be mixed with a signal VLO supplied from the local oscillator thereby to output a signal thus obtained as an IF output signal IFOUT. In FIG. 1, L1 to L4 are coils, T1 is an output transformer, C1 to C15 are capacitors, CV1 to CV3 are variable capacitors, C1A, C1B and C1C are ganged variable capacitors, R1 to R10 are resistors, and VSS is a source voltage.

In the conventional frequency mixer circuit shown in FIG. 1, the output signal VRF from the RF amplifier is applied to one gate of the MOS FET Q2 and the output signal VLO from the local oscillator is applied to the other gate of the MOS FET Q2. The one gate of the MOS FET Q2, which is provided with the output signal VRF, is also applied through the resistor R5 with a voltage obtained by dividing the source voltage (−VSS) through the resistors R6 and R7. This is for the so that the gate voltage of the MOS FET Q2 is fixedly set by an optimized direct current bias voltage thereby to control the conversion gain of the FET Q2.

With such a conventional frequency mixer circuit, the gates of one FET Q2 are respectively supplied with the output signals VRF and VLO for mixing these frequencies and, as a result, a local oscillator signal is required which is so high in voltage level (as high as several volts) that a square characteristic can be found in the drain current of the FET Q2. For this, an amplifier having a large output is required to amplify the local oscillator signal as well as the circuit current becomes large.

SUMMARY OF THE INVENTION

Thus, an object of this invention is to provide a frequency mixer circuit using field effect transistors, which is capable of operating without raising any problem even if a local oscillator signal is less than than several volts.

In a first aspect of this invention, a frequency mixer circuit having a differential transistor-pair composed of a first FET and a second FET whose performance characteristics are different from each other and whose sources are connected in common. In this circuit, a first alternating current (AC) signal is applied to the gate of the first FET, and a second alternating current signal is applied to the gate of the second FET.

With the frequency mixer circuit of the first aspect, the first and second FETs having different performance characteristics form a differential transistor-pair, and the first AC signal (for example, RF signal) is applied to the gate of the first FET as well as the second AC signal (for example, local oscillator signal) is applied to the gate of the second FET, so that each of the first and second FETs can be provided with a drain current having square characteristic. As a result, this circuit is adapted to be operated without raising any problem even if the local oscillator signal is small in signal level. This means that there is no need to use an amplifier for the local oscillator signal, resulting in a reduction in circuit current as well.

Here, the condition that is "different in performance characteristics" is satisfied in that the first and second FETs are at least different in transconductance parameter $\beta$ from each other. The first and second FETs may have the threshold voltages which are different from or equal to each other.

The transconductance parameter $\beta$ is defined as follows;

$$\beta = \mu_n \cdot (C_{ox}/2) \cdot (W/L)$$

where
$\mu_n$ = electron mobility
$C_{ox}$ = gate oxide film capacitance per unit area
$(W/L)$ = ratio of gate width (W) and gate length (L) of FET.

In a second aspect of this invention, a frequency mixer circuit is provided which has a first differential transistor-pair and a second differential transistor-pair, each of which comprises two dual gate FETs. The first differential pair is composed of first and second dual gate FETs whose sources are connected in common, and the second differential pair is composed of third and fourth dual gate FETs. The first and third FETs have respective first gates applied with a first DC voltage, and the first and fourth FETs have respective second gates applied with the first DC voltage. The second and fourth FETs have respective first gates applied with a second DC voltage different in value from the first DC voltage, and the second and third FETs have respective second gates applied with the second DC voltage.

With the frequency mixer circuit of the second aspect, respective two FETs of the first and second differential pairs have their first gates applied with different DC voltages from each other thereby to make their transconductance parameters different from each other, thus obtaining the sum current of the drain currents having a square characteristic. Consequently, frequency conversion can be operated without raising any problem even if the local oscillator signal level is low.

In a third aspect of this invention, a frequency mixer circuit is provided which comprises a first dual gate FET which has a first gate applied with a first alternating current (AC) signal and a second gate applied with a first DC voltage and a second dual gate FET which has a first gate applied with a second AC signal and a second gate applied with a second DC voltage different in voltage value from the first DC voltage. The first and second dual gate FETs form a differential transistor-pair and respectively have the sources connected in common to a current source.

With the frequency mixer circuit of the third aspect, the first gates of the first and second dual gate FETs forming the differential pair are applied respectively with different DC bias voltages from each other thereby to make the transconductance parameters different from each other, thus obtaining a drain current having square characteristic. Consequently, frequency conversion can be operated without raising any problem even if the local oscillator signal is small in signal level.

DESCRIPTION OF THE PREFERRED EMBODIMENTS

Preferred embodiments of this invention will be described below while referring to FIGS. 2 to 4.

First Embodiment

Figure 2:
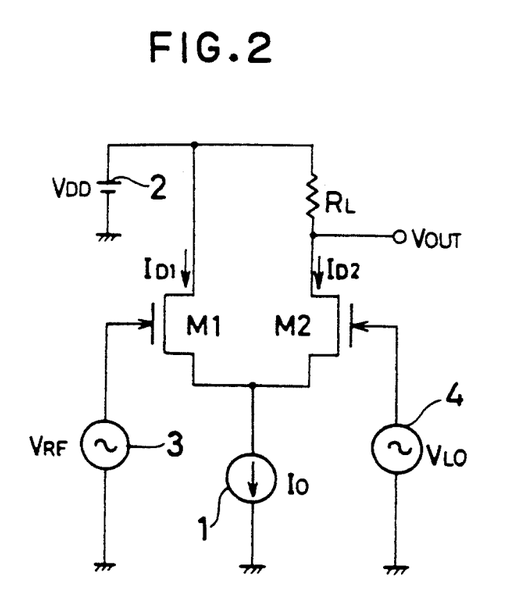
FIG. 2 is a circuit diagram of a frequency mixer circuit according to a first embodiment of this invention.

FIG. 2 shows a frequency mixer circuit according to a first embodiment of this invention.

In FIG. 2, MOS FETs M1 and M2 are different in performance characteristics from each other. That is, the both FETs M1 and M2 have different transconductance parameters and threshold voltages from each other. The FETs M1 and M2 form a differential pair, the sources of which are connected in common to a constant current source 1. This differential pair is driven by a constant current $I_0$ of the constant current source 1.

The FET M1 has the drain connected to a DC voltage source 2 (voltage $V_{DD}$) and the gate connected to a radio frequency (RF) signal source 3. The gate thereof is applied with an RF signal (voltage $V_{RF}$) as a first AC signal from the signal source 3.

The FET M2 has the drain connected through a load resistor $R_L$ to the DC voltage source 2 and the gate connected to a local oscillator signal source 4. This gate is applied with a local oscillator signal (voltage $V_{LO}$) as a second AC signal from the signal source 4. The drain current of the FET M2 is converted through the load resister $R_L$ into a voltage to be taken out as an output voltage $V_{OUT}$.

Next, the operational principle of the frequency mixer circuit as shown above will be explained below.

First, if transconductance parameters, the threshold voltages, the gate-to-source voltages of the FETs M1 and M2 are expressed as $\beta_1$ and $\beta_2$, $V_{TH1}$ and $V_{TH2}$, and $V_{GS1}$ and $V_{GS2}$, respectively, the drain current $I_{D1}$ of the FET M1 and the drain current $I_{D2}$ of the FET M2 can be expressed as follows;

$$I_{D1} = \beta_1(V_{GS1} - V_{TH1})^2 \tag{1}$$

$$I_{D2} = \beta_2(V_{GS2} - V_{TH2})^2 \tag{2}$$

Here, the difference of the threshold voltages $V_{TH1}$ and $V_{TH2}$ is expressed as $\Delta V_{TH}$, or $$V_{TH1} - V_{TH2} = \Delta V_{TH} \tag{3}$$

The sum of the drain currents $I_{D1}$ and $I_{D2}$ is equal to the constant current $I_0$ and the difference of the gate-to-source voltages $V_{GS1}$ and $V_{GS2}$ is equal to the difference of the RF signal voltage $V_{RF}$ and the local oscillator signal voltage $V_{LO}$, or $$I_{D1} + I_{D2} = I_0 \tag{4}$$

$$V_{GS1} - V_{GS2} = V_{RF} - V_{LO} \tag{5}$$

From equations (3), (4) and (5), the drain current $I_{D1}$ of the FET M1 and the drain current $I_{D2}$ of the FET M2 can be obtained as follows;.OJ OFF $$\begin{aligned}I_{D1} = &\{\beta_1/(\beta_1 + \beta_2)\} \cdot I_0 + \{\beta_2/(\beta_1 + \beta_2)\}^2 \cdot \\ &(V_{RF} - V_{LO} + \Delta T_{TH})^2 + [2 \cdot \{\beta_2/(\beta_1 + \beta_2)\} \cdot \\ &(\beta_1/\beta_2)^{\frac{1}{2}} \cdot (V_{RF} - V_{LO} + \Delta V_{TH}) \times \\ &[\{I_0/(\beta_1 + \beta_2)\} - (V_{RF} - V_{LO} + \Delta V_{TH})^2]^{\frac{1}{2}}]\end{aligned} \tag{6}$$

$$\begin{aligned}I_{D2} = &\{2 \cdot \beta_2/(\beta_1 + \beta_2)\} \cdot I_0 - \{\beta_2/(\beta_2 + \beta_2)\}^2 \cdot \\ &(V_{RF} - V_{LO} + \Delta V_{TH})^2 - [2 \{\beta_2/(\beta_1 + \beta_2)\}^2 \cdot \\ &(\beta_1/\beta_2)^{\frac{1}{2}} \cdot (V_{RF} - V_{LO} + \Delta V_{TH}) \times \\ &[\{I_0/(\beta_1 + \beta_2)\} - (V_{RF} - V_{LO} + \Delta V_{TH})^2]^{\frac{1}{2}}]]\end{aligned} \tag{7}$$

Referring to equations (6) and (7), the first terms are of DC component. Then, the second terms can be considered to be components proportional to $(V_{RF} - V_{LO} + \Delta V_{TH})^2$ and the third terms can be considered to be components proportional to $(V_{RF} - V_{LO} + \Delta V_{TH})$.

Here, $(V_{RF} - V_{LO} + \Delta V_{TH})^2$ of their second terms can be expanded as follows;

$$\begin{aligned}(V_{RF} - V_{LO} + \Delta V_{TH})^2 = &V_{RF}^2 + V_{LO}^2 + \Delta V_{TH}^2 - 2 \cdot \\ &V_{RF} V_{LO} - 2 \cdot V_{LO} \Delta V_{TH} + 2 \cdot \Delta V_{TH} \cdot V_{RF}\end{aligned} \tag{8}$$

Hence, if the RF signal $V_{RF}$ and the local oscillator signal $V_{LO}$ are given as shown below, the product $V_{RF} V_{LO}$ of the both signal can be obtained as follows;

$$V_{RF} = |V_{RF}| \cdot \cos(2\pi \cdot f_{RF} \cdot t) \tag{9}$$

$$V_{LO} = |V_{LO}| \cdot \cos(2\pi \cdot f_{LO} \cdot t) \tag{10}$$

$$\begin{aligned}V_{RF} \cdot V_{LO} &= |V_{RF}| \cdot |V_{LO}| \cdot \cos(2\pi \cdot f_{RF} \cdot t) \cdot \\ &\quad \cos(2\pi \cdot f_{LO} \cdot t) \\ &= (1/2)|V_{RF}| \cdot |V_{LO}| \cdot [\cos\{2\pi \cdot (f_{RF} + f_{LO}) \cdot t\} + \\ &\quad \cos\{2\pi \cdot (f_{RF} - f_{LO}) \cdot t\}]\end{aligned} \tag{11}$$

From equation (11), it can be found that the drain currents $I_{D1}$ and $I_{D2}$ each contains the component of the sum $(f_{RF} + f_{LO})$ and the component of the difference $|f_{RF} - f_{LO}|$ of the frequencies $f_{RF}$ and $f_{LO}$. As a result, in the circuit shown in FIG. 2, if one of the drain currents $I_{D1}$ and $I_{D2}$ is converted into a voltage and then, subjected to filtering, such an output signal that has the frequency component of the sum $(f_{RF} + f_{LO})$ or the difference $|f_{RF} - f_{LO}|$ of the frequencies $f_{RF}$ and $f_{LO}$ can be obtained. This means that in the circuit shown in FIG. 2, the frequency $f_{RF}$ of the RF signal $V_{RF}$ and the frequency $f_{LO}$ of the local oscillator signal $V_{LO}$ are mixed with each other.

In this embodiment, the output signal $V_{OUT}$ is obtained by converting the drain current $I_{D2}$ into a voltage, but not limited thereto, the load resistor $R_L$ may be provided between the drain of the FET M1 and the voltage source 2 thereby to convert the drain current $I_{D1}$ into a voltage. In addition, a field effect transistor or the like may be used as a dynamic load instead of the load resistor $R_L$. This means that any load may be used for this purpose if it makes possible to convert the drain current $I_{D1}$ or $I_{D2}$ into a voltage to obtain an output voltage.

As explained above, according to this embodiment, the FETs M1 and M2 different in performance characteristics form a differential transistor-pair and the gates of which are applied respectively with the RF signal and local oscillator signal, so that even if the level of the local oscillator signal is small, the frequency conversion can be easily operated without raising any problem.

Second Embodiment

Figure 3:
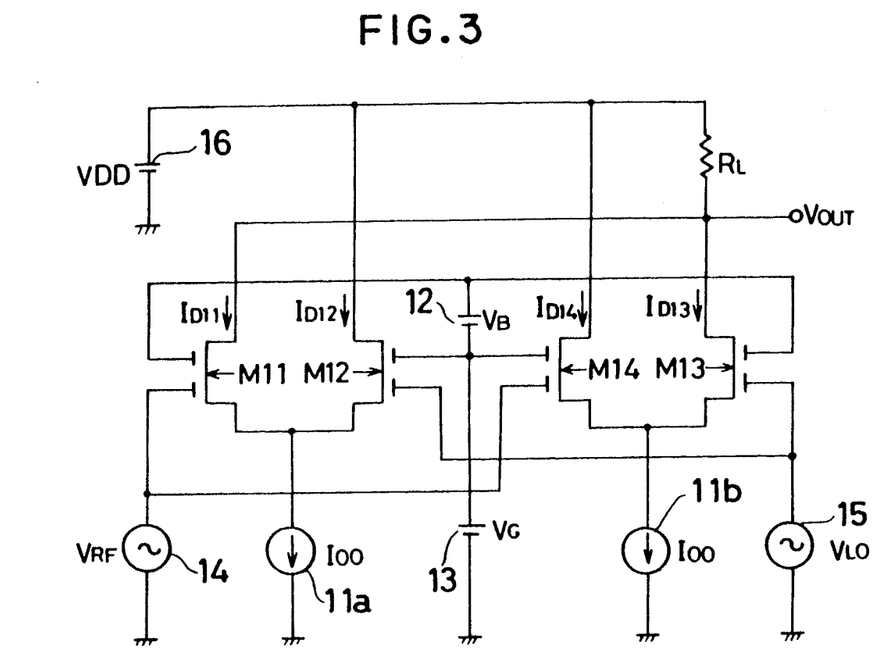
FIG. 3 is a circuit diagram of a frequency mixer circuit according to a second embodiment of this invention.

FIG. 3 shows a frequency mixer circuit according to a second embodiment of this invention, which includes four MOS dual gate FETs M11, M12, M13 and M14. Of which, the FETs M11 and M12 form a first differential pair, the sources of which are connected in common to a constant current source 11a to be driven by a constant current $I_{00}$ thereof. The FETs M13 and M14 form a second differential pair, the sources of which are connected in common to a constant current source 11b to be driven by the constant current $I_{00}$ thereof.

The connection of the first and second differential transistor-pairs is made as follows;

The first gate of the FET M11 and the first gate of the FET M13 are connected in common to the positive polarity side of a DC voltage source 12 (voltage $V_B$), and the first gate of the FET M12 and the first gate of the FET M14 are connected in common to the negative polarity side of the voltage source 12 as well as connected in common to the positive polarity side of a direct current voltage source 13 (voltage $V_G$). The negative polarity side of the voltage source 13 is connected to the ground.

The direct current voltage sources 12 and 13 are connected in series, so that the first gates of the FETs M11 and M13 each is applied with the sum of the voltages $V_B$ and $V_G$ of the both voltage sources 12 and 13, or ($V_B+V_G$), as the DC bias voltage, and the first gates of the FETs M12 and M14 each is applied with the voltage $V_G$ as the DC bias voltage. As a result, the transconductance parameters of the FETs M11, M12, M13 and M14 are increased or decreased monotonely with a change in the magnitude of the DC bias voltage to be applied. Accordingly, the drain currents thereof are also increased or decreased monotonely with a change in the magnitude of the DC bias voltage.

The second gate of the FET M11 and the second gate of the FET M14 are connected in common to a radio frequency (RF) signal source 14, whereby an RF signal (voltage $V_{RF}$) is applied between these second gates and the earth as a first AC signal. The second gate of the FET M12 and the second gate of the FET M13 are connected in common to a local oscillator signal source 15, whereby a local oscillator signal (voltage $V_{LO}$) is applied between these second gates and the earth as a second AC signal.

The drain of the FET M12 and the drain of the FEt M14 are connected in common directly to a DC voltage source 16 (voltage $V_{DD}$). The drain of the FET M11 and the drain of FET M13 are connected in common to the DC voltage source 16 through a load resistor $R_L$.

In this embodiment, the sum current of the drain currents of the FETs M11 and M13 is converted through the load resistor $R_L$ into a voltage to be taken out as an output voltage $V_{OUT}$ to the outside.

The FETs M11 and M12 forming the first differential pair are different in performance characteristics from each other and the FETs M13 and M14 forming the second differential pair are also different in performance characteristics from each other. However, the FETs M12 and M14 are equal in performance characteristics to each other, and the FETs M11 and M13 are also equal in performance characteristics to each other.

Next, the operational principle of the circuit as shown above will be explained below.

First, in the first differential pair, the drain current $I_{D11}$ of the FET M11 can be expressed in terms of transconductance parameter $\beta_{11}$, the gate-to-source voltage $V_{GS11}$ and the threshold voltage $V_{TH}$ as follows;

$$I_{D11} = \beta_{11}(V_{GS11} - V_{TH})^2 \quad (12)$$

Similarly, the drain currents $I_{D12}$ of the FET M12 can be expressed in terms of transconductance parameter $\beta_{12}$, the gate-to-source voltage $V_{GS2}$ and the threshold voltage $V_{TH}$ as follows;

$$I_{D12} = \beta_{12}(V_{GS12} - V_{TH})^2 \quad (13)$$

Also, the sum current of the drain currents $I_{D11}$ and $I_{D12}$ is equal to the constant current $I_{00}$, and the difference of the gate-to-source voltages $V_{GS11}$ and $V_{GS12}$ is equal to the difference of the RF signal voltage $V_{RF}$ and the local oscillator signal voltage $V_{LO}$, or $$I_{D11} + I_{D12} = I_{00} \quad (14)$$

$$V_{GS11} - V_{GS12} = V_{RF} - V_{LO} \quad (15)$$

The transconductance parameter $\beta_{11}$ is a function of the DC bias voltage ($V_B+V_G$) applied to the first gate and changed monotonely with a change in the voltage ($V_B+V_G$) as shown by the following equation (16), and the transconductance parameter $\beta_{12}$ is a function of the DC bias voltage $V_G$ applied to the first gate and changed monotonely with a change in the DC bias voltage $V_G$ as shown by the following equation (17) as:

$$\beta_{11} = \beta_{11}(V_B + V_G) \quad (16)$$

$$\beta_{12} = \beta_{12}(V_G) \quad (17)$$

Here, $\beta_{11}$ and $\beta_{12}$ are different in value from each other, and if the ratio of $\beta_{11}$ and $\beta_{12}$ is expressed as $K_1$ ($K_1 \neq 1$), or $$K_1 = \beta_{11}/\beta_{12} = \beta_{11}/\beta_0 \quad (18),$$

the drain currents $I_{D11}$ and $I_{D12}$ can be obtained as follows;

$$\begin{aligned} I_{D11} = &\{K_1/(1+K_1)\} \cdot I_{00} + \{K_1 \cdot \beta_0 \cdot \\ & (V_{RF} - V_{LO})^2/(1+K_1)^2\} + \\ & [2 \cdot \beta_0 \cdot K_1 \cdot (V_{RF} - V_{LO}) \cdot \{1/(1+K_1)^2\} \times \\ & \{(1+K_1) \cdot (I_{00}/\beta_0) - K_1 \cdot (V_{RF} - V_{LO})^2\}^{\frac{1}{2}}] \end{aligned} \quad (19)$$

$$\begin{aligned} I_{D12} = &\{2/(1+K_1)\} \cdot I_{00} - \{K_1 \cdot \beta_0 \cdot \\ & (V_{RF} - V_{LO})^2/(1+K_1)^2\} - \\ & [2 \cdot \beta_0 \cdot K_1 \cdot (V_{RF} - V_{LO}) \cdot \{1/(1+K_1)^2\} \times \\ & \{(1+K_1) \cdot (I_{00}/\beta_0) - K_1 \cdot (V_{RF} - V_{LO})^2\}^{\frac{1}{2}}] \end{aligned} \quad (20)$$

In equations (19) and (20), their first terms are of DC components. Also, their second and third terms can be considered to be components proportional to $(V_{RF} - V_{LO})^2$ and $(V_{RF} - V_{LO})$, respectively.

By the same principle as above, the drain currents of the second differential pair formed of the FETs M13 and M14 can be obtained.

The drain currents $I_{D13}$ of the FET M13 can be expressed in terms of transconductance parameter $\beta_{13}$, the gate-to-source voltage $V_{GS13}$ and the threshold voltage $V_{TH}$ as follows;

$$I_{D13} = \beta_{13}(V_{GS13} - V_{TH})^2 \quad (21)$$

Similarly, the drain current $I_{D14}$ of the FET M14 can be expressed in terms of transconductance parameter $\beta_{14}$, the gate-to-source voltage $V_{GS14}$ and the threshold voltage $V_{TH}$ as follows;

$$I_{D14} = \beta_{14}(V_{GS14} - V_{TH})^2 \quad (22)$$

Besides, the following equations can be established as;

$$I_{D13} + I_{D14} = I_{00} \quad (23)$$

$$V_{GS13} - V_{GS14} = V_{LO} - V_{RF} \quad (24)$$

The transconductance parameter $\beta_{13}$ is a function of the DC bias voltage $(V_B + V_G)$ and changed monotonely with a change in the value $(V_B + V_G)$, and the transconductance parameter $\beta_{14}$ is a function of the DC bias voltage $V_G$ and changed monotonely with a change in the value $V_G$.

Here, if the ratio of $\beta_{13}$ and $\beta_{14}$ is equal to $K_1$, or $$K_1 = \beta_{13}/\beta_{14} = \beta_{13}/\beta_0 \quad (25),$$

the drain current $I_{D13}$ of the FET M13 and the drain current $I_{D14}$ of the FET M14 can be obtained as follows;

$$I_{D13} = \{K_1/(1 + K_1)\} \cdot I_{00} + \{K_1 \cdot \beta_0 \cdot (V_{LO} - V_{RF})^2/(1 + K_1)^2\} + [2 \cdot \beta_0 \cdot K_1 \cdot (V_{LO} - V_{RF}) \cdot \{1/(1 + K_1)^2\} \times \{(1 + K_1) \cdot (I_{00}/\beta_0) - K_1 \cdot (V_{LO} - V_{RF})^2\}^{\frac{1}{2}}] \quad (26)$$

$$I_{D14} = \{2/(1 + K_1)\} \cdot I_{00} - \{K_1 \cdot \beta_0 \cdot (V_{LO} - V_{RF})^2/(1 + K_1)^2\} - [2 \cdot \beta_0 \cdot K_1 \cdot (V_{LO} - V_{RF}) \cdot \{1/(1 + K_1)^2\} \times \{(1 + K_1) \cdot (I_{00}/\beta_0) - K_1 \cdot (V_{LO} - V_{RF})^2\}^{\frac{1}{2}}] \quad (27)$$

In equation (26) and (27), their first terms are of DC component. Besides, their second and third terms are considered to be components proportional to $(V_{LO} - V_{RF})^2$ and $(V_{LO} - V_{RF})$, respectively.

From equations (19), (20), (26) and (27), the sum current of the drain currents $I_{D11}$ and $I_{D13}$ of the FETs M11 and M13, or $(I_{D11} + I_{D13})$, and the sum current of the drain currents $I_{D12}$ and $I_{D14}$ of the FETs M12 and M14, or $(I_{D12} + I_{D14})$ can be obtained as follows;.oj off $$I_{D11} + I_{D13} = \{2K_1/(1+K_1)\} \cdot I_{00} + \{2 \cdot \beta_0 \cdot (V_{RF} - V_{LO})^2/(1+K_1)^2\} \quad (28)$$

$$I_{D12} + I_{D14} = \{4/(1+K_1)\} \cdot I_{00} - \{2 \cdot \beta_0 \cdot (V_{RF} - V_{LO})^2/(1+K_1)^2\} \quad (29)$$

In equations (28) and (29), the term $(V_{RF} - V_{LO})^2$ can be expanded as follows;

$$(V_{RF} - V_{LO})^2 = V_{RF}^2 + V_{LO}^2 - 2 \cdot V_{RF} \cdot V_{LO} \quad (30)$$

Here, when the RF signal voltage $V_{RF}$ is expressed as shown by equation (9) and the local oscillator signal voltage $V_{LO}$ is expressed as shown by equation (10), the product $V_{RF} V_{LO}$ of the both signals can be obtained as shown by equation (11) and as a result, it can be found that the sums of the drain currents, or $(I_{D11} + I_{D13})$ and $(I_{D12} + I_{D14})$ respectively contain the component of the sum $(f_{RF} + V_{LO})$ and the component of the difference $|f_{RF} - V_{LO}|$ of the frequencies $f_{RF}$ and $f_{LO}$.

Accordingly, if the sum current $(I_{D11} + I_{D13})$ of the drain currents $I_{D11}$ and $I_{D13}$ or the sum current $(I_{D12} + I_{D14})$ of the drain currents $I_{D12}$ and $I_{D14}$ is converted into a voltage and then, subjected to filtering, such an output signal that has the frequency component of the sum $(f_{RF} + V_{LO})$ or the difference $|f_{RF} - V_{LO}|$ of the frequencies $f_{RF}$ and $f_{LO}$ can be obtained. This means that in the second embodiment, the frequency $f_{RF}$ of the RF signal voltage $V_{RF}$ and the frequency $f_{LO}$ of the local oscillator signal voltage $V_{LO}$ are mixed with each other.

In this embodiment, the sum current $(I_{D11} + I_{D13})$ of the drain currents $I_{D11}$ and $I_{D13}$ is converted into a voltage to obtain the output signal $V_{OUT}$, but not limited thereto, the load resistor $R_L$ may be provided between the drains of the FETs M12 and M14 and the voltage source 16 thereby to convert the sum current $(I_{D12} + I_{D14})$ of the drain currents $I_{D12}$ and $I_{D14}$ into a voltage. In addition, a field effect transistor or the like may be used as a dynamic load instead of the load resistor $R_L$. This means that any load may be used for this purpose if it makes possible to convert the sum current $(I_{D11} + I_{D13})$ or $(I_{D12} + I_{D14})$ into a voltage to obtain an output voltage.

As explained above, according to this embodiment, the DC current bias voltages $(V_B + V_G)$ and $V_G$ are applied respectively to the first gates of the dual gate FETs M11 and M12 forming the first differential pair, and the DC current bias voltages $(V_B + V_G)$ and $V_G$ are applied respectively to the first gates of the dual gate FETs M13 and M14 forming the second differential pair and as a result, the transconductance parameters of the two FETs of each of the first and second differential pairs are made different from each other thereby to obtain a sum current of the drain currents thereof having a square characteristic. Consequently, even if the local oscillator signal level is small, the frequency conversion can be operated without raising any problem.

Third Embodiment

Figure 4:
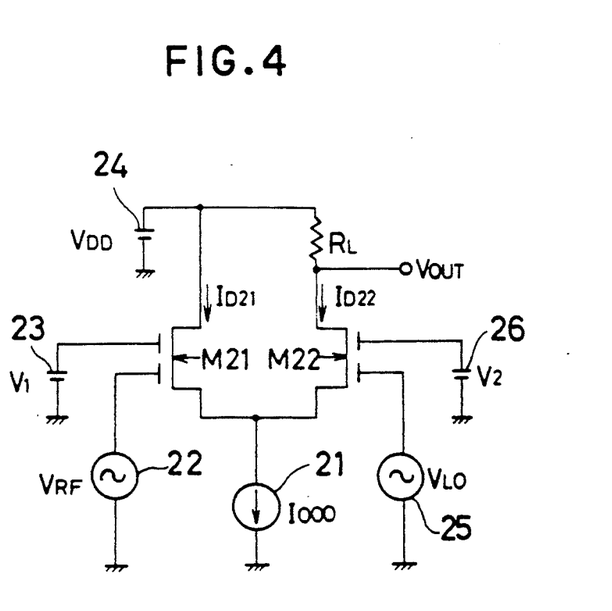
FIG. 4 is a circuit diagram of a frequency mixer circuit according to a third embodiment of this invention.

FIG. 4 shows a frequency mixer circuit according to a third embodiment of this invention, which includes two MOS dual gate FETs M21 and M22 forming a differential pair. The sources of the FETs M21 and M22 are connected in common to a constant current source 21 to be driven by its constant current $I_{000}$.

The drain of the FET M21 is connected directly to the positive polarity side of a DC voltage source 24 (voltage $V_{DD}$). The first gate of the FET M21 is connected to the positive polarity side of a DC voltage source 23 to be applied with a DC bias voltage $V_1$ therefrom. The second gate thereof is connected to a radio frequency (RF) signal source 22 to be applied with a RF signal (voltage $V_{RF}$) therefrom.

The drain of the FET M22 is connected through a load resistor $R_L$ to the voltage source 24. The first gate thereof is connected to the positive polarity side of a DC voltage source 26 to be applied with a DC bias voltage $V_2$ different in value from the DC bias voltage $V_1$ (or $V_1 \neq V_2$) therefrom. The second gate thereof is connected to a local oscillator signal source 25 to be applied with a local oscillator signal (voltage $V_{LO}$) therefrom.

The drain current of the FET M22 is converted through the load resistor $R_L$ into a voltage and taken out to the outside as an output voltage $V_{OUT}$.

Next, the operational principle of the frequency mixer circuit shown above will be explained below.

First, the drain current $I_{D21}$ of the FET M21 can be expressed in terms of transconductance parameter $\beta_{21}$, the gate-to-source voltage $V_{GS21}$ and the threshold voltage $V_{TH}$ as follows;

$$I_{D21} = \beta_{21}(V_{GS21} - V_{TH})^2 \quad (31)$$

Similarly, the drain current $I_{D22}$ of the FET M22 can be expressed in terms of transconductance parameter $\beta_{22}$, the gate-to-source voltage $V_{GS22}$ and the threshold voltage $V_{TH}$ as follows;

$$I_{D22} = \beta_{22}(V_{GS22} - V_{TH})^2 \quad (32)$$

Here, the sum of the drain currents $I_{D21}$ and $I_{D22}$ is equal to the constant current $I_{000}$ and the difference of the gate-to-source voltages $V_{GS21}$ and $V_{GS22}$ is equal to the difference of the RF signal voltage $V_{RF}$ and the local oscillator signal voltage $V_{LO}$, or $$I_{D21} + I_{D22} = I_{000} \quad (33)$$

$$V_{GS21} - V_{GS22} = V_{RF} - V_{Lo} \quad (34)$$

The transconductance parameter $\beta_{22}$ is a function of the DC bias voltage $V_1$ applied to the FET M21, and the transconductance parameter $\beta_{22}$ is a function of the DC bias voltage $V_2$ applied to the FET M22, or $$\beta_{21} = \beta_{21}(V_1) \quad (35)$$

$$\beta_{22} = \beta_{21}(V_1) \quad (35)$$

The bias voltages to be applied are different from each other and as a result, the transconductance parameters $\beta_{21}$ and $\beta_{22}$ are made different in value from each other. Thus, if the ratio of $\beta_{21}$ and $\beta_{22}$ is expressed as $K_2$ ($K_2 \neq 1$), or $$K_2 = \beta_{21}/\beta_{22} \quad (37),$$

the drain current $I_{D21}$ of the FET M21 and the drain current $I_{D22}$ of the FET M22 can be obtained as follows;

$$\begin{aligned} I_{D21} = & \{K_2/(1+K_2)\} \cdot I_{000} + \{K_2 \cdot \beta_{22} \cdot \\ & (V_{RF} - V_{LO})^2/(1+K_2)^2\} + \\ & [2 \cdot \beta_{22} \cdot K_2 \cdot (V_{RF} - V_{LO}) \cdot \{1/(1+K_2)^2\} \times \\ & \{(1+K_2) \cdot (I_{000}/\beta_{22}) - K_2 \cdot (V_{RF} - V_{LO})^2\}^{\frac{1}{2}}] \end{aligned} \quad (38)$$

$$\begin{aligned} I_{D22} = & \{2/(1+K_2)\} \cdot I_{000} - \{K_2 \cdot \beta_{22} \cdot \\ & (V_{RF} - V_{LO})^2/(1+K_2)^2\} - \\ & [2 \cdot \beta_{22} \cdot K_2 \cdot (V_{RF} - V_{LO}) \cdot \{1/(1+K_2)^2\} \times \\ & \{(1+K_2) \cdot (I_{000}\beta_{22}) - K_2 \cdot (V_{RF} - V_{LO})^2\}^{\frac{1}{2}}] \end{aligned} \quad (39)$$

In equations (36) and (37), their first terms are of DC component. The second and third terms are considered to be components proportional to $(V_{RF} - V_{LO})^2$ and $(V_{RF} - V_{LO})$, respectively.

Here, $(V_{RF} - V_{LO})^2$ can be expanded as follows; OJ OFF $$(V_{RF} - V_{LO})^2 = V_{RF}^2 + V_{LO}^2 - 2 \cdot V_{RF} V_{LO} \quad (40)$$

Here, as shown in the first and second embodiments, when the RF signal voltage $V_{RF}$ is expressed as shown by equation (9) and the local oscillator signal voltage $V_{LO}$ is expressed by equation (10), the product $V_{RF} \cdot V_{LO}$ of the both signals can be obtained as shown by equation (11). As a result, it can be found that the drain currents $I_{D21}$ and $I_{D22}$ respectively contain the component of the sum $(f_{RF} - f_{LO})$ and the component of the difference $|f_{RF} - f_{LO}|$ of the frequencies $f_{RF}$ and $f_{LO}$.

Accordingly, if one of the drain currents $I_{D21}$ and $I_{D22}$ is converted into a voltage and then, subjected to filtering, such an output signal that has the frequency component of the sum $(f_{RF} + f_{LO})$ or the difference $|f_{RF} - f_{LO}|$ of the frequencies $f_{RF}$ and $f_{LO}$ can be obtained. This means that the circuit shown in FIG. 4 makes possible to mix the frequency $f_{RF}$ of the RF signal $V_{RF}$ and the frequency $f_{LO}$ of the local oscillator signal $V_{LO}$ with each other.

In this embodiment, the drain current $I_{D22}$ is converted into a voltage to obtain the output voltage $V_{OUT}$, but not limited thereto, the load resistor $R_L$ may be provided between the drain of the FET M21 and the voltage source 24 thereby to convert the drain current $I_{D21}$ into a voltage. In addition, a field effect transistor or the like may be used as a dynamic load instead of the load resistor $R_L$. This means that any load may be used for this purpose if it makes possible to convert the drain current $I_{D21}$ or $I_{D22}$ into a voltage to obtain an output voltage.

As explained above, according to this embodiment, different DC bias voltages are applied respectively to the first gates of the dual gate FETs M21 and M22 forming the differential pair and as a result, respective transconductance parameters $\beta_{21}$ and $\beta_{22}$ of the FETs M21 and M22 are made different with each other thereby to obtain a drain current having a square characteristic. Consequently, even if the local oscillator signal level is small, the frequency conversion can be performed without raising any problem.

According to the above-described embodiments, each frequency mixer circuit uses N-channel MOS FETs, but not limited thereto, FETs having any channel polarity can be used as well as any other types of FET than MOS-type can be used for this purpose. For example, a metal semiconductor (MES) FET or a heterojunction FET such as a high electron mobility transistor (HEMT) can be used. In addition, not only an FET formed of an element semiconductor such as Si and but also an FET formed of a compound semiconductor such as GaAs can be used.

What is claimed is:

1. A frequency mixer circuit comprising:
   a differential pair including a first field effect transistor and a second field effect transistor whose performance characteristics are different from each other and whose sources are connected in common;
   said first field effect transistor having a gate supplied with a first alternating current signal; and
   said second field effect transistor having a gate supplied with a second alternating current signal.

2. The frequency mixer circuit as claimed in claim 1, wherein an output signal is provided by converting a drain current of one of said first and second field effect transistors into a voltage.

3. The frequency mixer circuit as claimed in claim 1, wherein said first and second field effect transistors are different in transconductance parameters from each other.

4. The frequency mixer circuit as claimed in claim 3, wherein said first and second field effect transistors are different in threshold voltage from each other.

5. A frequency mixer circuit comprising:
a first differential pair including a first dual gate field effect transistor and a second dual gate field effect transistor whose sources are connected in common to a first current source;
a second differential pair including a third dual gate field effect transistor and a fourth dual gate field effect transistor whose sources are connected in common to a second current source;
said first and third field effect transistors having respective drains connected to each other and said second and fourth field effect transistors having respective drains connected to each other; and
said first and third field effect transistors having respective first gates supplied with a first direct current voltage and said second and fourth field effect transistors having respective first gates supplied with a second direct current voltage which is different in value from said first direct current voltage.

6. The frequency mixer circuit as claimed in claim 5, wherein a first sum of drain currents of said first and third field effect transistors and a second sum of drain currents of said second and fourth field effect transistors are generated, and an output signal produced by converting one of said first and said second sums into a voltage.

7. The frequency mixer circuit as claimed in claim 5, wherein said first and third field effect transistors are equal in performance characteristics to each other and said second and fourth field effect transistors are equal in performance characteristics to each other.

8. The frequency mixer circuit as claimed in claim 7, wherein said first and third field effect transistors are equal in transconductance parameters to each other and said second and fourth field effect transistors are equal in transconductance parameter to each other.

9. The frequency mixer circuit as claimed in claim 8, wherein a ratio of respective transconductance parameters of said first and second field effect transistors and a ratio of respective transconductance parameters of said third and fourth field effect transistors are equal to each other.

10. The frequency mixer circuit as claimed in claim 5, further comprising:
a first voltage source for generating a first supply voltage and a second voltage source for generating a second supply voltage connected in series;
said first direct current voltage being equal to a sum of said first and second supply voltages; and
said second direct current voltage being equal to one of said first and said second supply voltages.

11. The frequency mixer circuit as claimed in claim 5, wherein said first and fourth field effect transistors have respective second gates supplied with a ratio frequency signal and said second and third field effect transistors have respective second gates supplied with an oscillator signal.

12. The frequency mixer circuit as claimed in claim 5, wherein said second and fourth field effect transistors have respective drains supplied with a direct current voltage.

13. The frequency mixer circuit as claimed in claim 12, further comprising a resistive element connected between said commonly connected drains of said second and fourth field effect transistors and said commonly connected drains of said first and third field effect transistors.

14. A frequency mixer circuit comprising:
a first dual gate field effect transistor and a second dual gate field effect transistor which form a differential pair;
said first and second field effect transistors having respective sources connected in common to a current source by which said first and second field effect transistors are driven;
said first field effect transistor having a first gate applied with a first alternating current signal and a second gate applied with a first direct current voltage; and
said second field effect transistor having a first gate applied with a second alternating current signal and a second gate applied with a second direct current voltage which is different in value from said first direct current voltage.

15. The frequency mixer circuit as claimed in claim 14, wherein an output signal is taken out by converting a drain current of one of said first and second field effect transistors into a voltage.

* * * * *